(12) United States Patent
Kovac et al.

(10) Patent No.: US 6,723,584 B2
(45) Date of Patent: Apr. 20, 2004

(54) METHODS OF MAKING MICROELECTRONIC ASSEMBLIES INCLUDING COMPLIANT INTERFACES

(75) Inventors: Zlata Kovac, Los Alamitos, CA (US); Craig Mitchell, San Jose, CA (US); Thomas Distefano, Monte Sereno, CA (US); John Smith, Horseshoe Bay, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/255,297

(22) Filed: Sep. 26, 2002

(65) Prior Publication Data

US 2003/0027374 A1 Feb. 6, 2003

Related U.S. Application Data

(60) Division of application No. 09/517,852, filed on Mar. 2, 2000, now Pat. No. 6,525,429, which is a division of application No. 08/842,313, filed on Apr. 24, 1997, now Pat. No. 6,133,639, which is a division of application No. 08/365,699, filed on Dec. 29, 1994, now Pat. No. 5,659,952, which is a continuation-in-part of application No. 08/309,433, filed on Sep. 20, 1994, now abandoned.

(51) Int. Cl.[7] .............................. H01L 21/48; H05K 3/34
(52) U.S. Cl. ...................... 438/118; 438/122; 438/127; 29/840
(58) Field of Search ............................. 438/22, 26, 48, 438/121, 122, 127, 612, 613, 343, 413, 106, 108, 109, 117, 118, 119, 125, 126; 156/330; 174/52.1–52.4, 256, 259, 260; 29/832, 840; 257/687, 773, 774, 778, 779, 780, 782, 783

(56) References Cited

U.S. PATENT DOCUMENTS

| 4,190,855 A | 2/1980 | Inoue |  |
| 4,300,153 A | 11/1981 | Hayakawa et al. | 257/668 |
| 4,381,602 A | 5/1983 | McIver | 29/840 |
| 4,396,936 A | 8/1983 | McIver et al. | 257/713 |
| 4,642,889 A | 2/1987 | Grabbe | 29/840 |
| 4,955,132 A | 9/1990 | Ozawa | 29/840 |
| 5,001,542 A | 3/1991 | Tsukagoshi et al. | 257/746 |
| 5,082,811 A | 1/1992 | Bruno | 501/134 |
| 5,110,388 A | 5/1992 | Komiyama et al. | 156/229 |
| 5,140,404 A | 8/1992 | Fogal et al. | 257/783 |
| 5,148,265 A | 9/1992 | Khandros et al. | 257/773 |

(List continued on next page.)

FOREIGN PATENT DOCUMENTS

| JP | 1-155633 A | 6/1989 |
| JP | 1-164054 | 6/1989 |
| JP | 1-235261 | 9/1989 |
| JP | 1-253926 | 10/1989 |
| JP | 1-278755 | 11/1989 |
| JP | 2-056941 | 2/1990 |
| JP | 4-91443 | 3/1992 |
| JP | 4-137641 | 5/1992 |
| WO | 94/03036 | 2/1994 |

*Primary Examiner*—Alonzo Chambliss
(74) *Attorney, Agent, or Firm*—Lerner, David, Littenberg, Krumholz & Mentlik, LLP

(57) ABSTRACT

A method of making a microelectronic assembly including a compliant interface includes providing a first support structure such as a flexible dielectric sheet having a first surface and a porous resilient layer on the first surface of the first support structure, stretching the first support structure and bonding the stretched first support structure to a ring structure. A platen is provided in engagement with a second surface of the first support structure. The first surface of a second support structure, such as a semiconductor wafer, is abutted against the porous layer and, after the abutting step, a first curable liquid is disposed between the first and second support structures and within the porous layer. The first curable liquid may be at least partially cured.

20 Claims, 7 Drawing Sheets

U.S. PATENT DOCUMENTS

| | | | |
|---|---|---|---|
| 5,148,266 A | 9/1992 | Khandros et al. | 257/773 |
| 5,194,930 A | 3/1993 | Papthomas et al. | 257/773 |
| 5,203,076 A | 4/1993 | Banerji et al. | 29/840 |
| 5,225,966 A | 7/1993 | Basavanhally et al. | 361/406 |
| 5,249,101 A | 9/1993 | Frey et al. | 361/717 |
| 5,265,329 A | 11/1993 | Jones et al. | 29/832 |
| 5,316,788 A | 5/1994 | Dibble et al. | 427/98 |
| 5,349,240 A | 9/1994 | Narita et al. | 257/791 |
| 5,355,283 A | 10/1994 | Marrs et al. | 361/760 |
| 5,363,277 A | 11/1994 | Tanaka | 361/760 |
| 5,371,404 A | 12/1994 | Juskey et al. | 257/659 |
| 5,431,571 A | 7/1995 | Hanrahan et al. | 439/91 |
| 5,477,611 A | 12/1995 | Sweis et al. | 29/840 |
| 5,483,106 A | 1/1996 | Echigo et al. | 257/783 |
| 5,563,445 A | 10/1996 | Iijima et al. | 257/698 |
| 5,656,862 A | 8/1997 | Papathomas et al. | 257/778 |
| 5,659,952 A * | 8/1997 | Kovac et al. | 29/840 |
| 5,929,517 A | 7/1999 | DiStefano et al. | 257/707 |
| 6,030,856 A * | 2/2000 | DiStefano et al. | 438/117 |
| 6,133,639 A | 10/2000 | Kovac et al. | 257/778 |
| 6,255,738 B1 * | 7/2001 | Distefano et al. | 257/788 |
| 6,373,141 B1 * | 4/2002 | DiStefano et al. | 257/783 |
| 6,525,429 B1 * | 2/2003 | Kovac et al. | 257/778 |

* cited by examiner

METHODS OF MAKING MICROELECTRONIC ASSEMBLIES INCLUDING COMPLIANT INTERFACES

CROSS REFERENCE TO RELATED APPLICATIONS

This application is a divisional of U.S. patent application Ser. No. 09/517,852 filed Mar. 2, 2000, now U.S. Pat. No. 6,525,429, which in turn is a divisional of application Ser. No. 08/842,313, filed Apr. 24, 1997, now U.S. Pat. No. 6,133,639 which in turn is a divisional of U.S. patent application Ser. No. 08/365,699, filed Dec. 29, 1994, now U.S. Pat. No. 5,659,952, which in turn is a continuation-in-part of U.S. patent application Ser. No. 08/309,433, filed Sep. 20, 1994, now abandoned, the disclosures of which are hereby incorporated by reference herein.

BACKGROUND OF THE INVENTION

The present invention relates, generally, to providing a compliant interface for a semiconductor chip, and more particularly relates to a method and apparatus for providing a compliant interface to accommodate for differences in the thermal coefficient of expansion mismatch between a semiconductor chip and a support structure, such as a printed wiring board.

In attempting to use the area on printed wiring boards more efficiently, semiconductor chip manufacturers have recently been switching from larger, more cumbersome interconnection conventions, such as pin grid arrays ("PGAs") and the perimeter leaded quad flat packs ("QFPs"), to smaller conventions, such as ball grid arrays ("BGAs"). Using BGA technology, semiconductor chips are typically interconnected to their supporting substrates using solder connections, such as with "flip-chip" technology. However, when solder alone is used to interconnect the chip contacts to the substrate, the columns of solder are generally designed to be short to maintain the solder's structural integrity. This results in minimal elastic solder connection properties which further results in increased susceptibility to solder cracking due to the mechanical stress of the differential thermal coefficient of expansion ("TCE") of the chip relative to the supporting substrate thereby reducing the reliability of the solder connection. In other words, when the chip heats up during use, both the chip and the substrate expand; and when the heat is removed, both the chip and the substrate contract. The problem that arises is that the chip and the substrate expand and contract at different rates and at different times, thereby stressing the interconnections between them. As the features of semiconductor chips continue to be reduced in size, the number of chips packed into a given area will be greater and the heat dissipated by the each of these chips will have a greater effect on the thermal mismatch problem. This further increases the need for a highly compliant interconnection scheme for the chips.

The solder cracking problem is exacerbated when more than one semiconductor chip is mounted in a package, such as in a multichip module. Multichip modules continue to grow in popularity; however, as more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing overall rigidity of the connection between the module and its supporting substrate.

An interconnection solution put forth in U.S. Pat. No. 4,642,889, entitled "Compliant Interconnection and Method Therefor" issued to Grabbe seeks to alleviate the aforementioned solder cracking problem by embedding wires within each solder column to reinforce the solder thereby allowing higher solder pedestals and more elasticity. Another solution includes spirally wrapping wire around the outside of the solder. A further solution put forth includes providing a combination of solder and high lead solder, as found in U.S. Pat. No. 5,316,788, entitled "Applying Solder to High Density Substrates" issued to Dibble et al.

Still other prior art solutions make use of a underfill material disposed between the chip and the supporting substrate in an attempt to reduce the stress caused by TCE mismatch. Without the underfill material, this stress is typically concentrated at the weakest part of the solder balls. The underfill material allows this stress to be more uniformly spread out over the entire surface of the solder balls. Examples of the use of underfill materials may be found in U.S. Pat. Nos. 5,194,930, 5,203,076 and 5,249,101. All of these prior art solutions are aimed at reducing the shear stress endured by the interconnections caused by thermal cycling. However, each of these solutions also encounters significant problems such as insufficient compliance and process cost.

Several inventions, commonly assigned to the assignee of the present invention, deal effectively, but specifically differently, with the thermal cycling problem. For example, U.S. Pat. No. 5,148,266 discloses improvements in semiconductor chip assemblies and methods of making the same. As set forth in the '266 patent, a semiconductor chip can be connected to a substrate using a sheet-like, and preferably flexible, interposer. The interposer overlies the top, contact-bearing surface of the chip. A first surface of the interposer faces towards the chip whereas a second surface faces away from the chip. Electrical terminals are provided on the second surface of the interposer, and the interposer is provided with apertures extending through it. Flexible leads extend through these apertures between contacts on the chip and the terminals on the second surface of the interposer. The terminals can be bonded to a substrate. Because the terminals are movable relative to the contacts on the chip, the arrangements described in the '266 patent provide excellent resistance to differential expansion of the chip relative to the substrate caused by thermal cycling. The interposer disclosed in the '266 patent may also include a compliant layer disposed between the terminals and the chip.

Copending, commonly assigned U.S. patent application Ser. No. 08/123,882, filed Sep. 20, 1993, the disclosure of which is hereby incorporated herein by reference, discloses a method for creating an interface between a chip and chip carrier including spacing the chip a given distance above the chip carrier, and introducing a liquid in the gap between the chip and carrier. Preferably, the liquid is an elastomer which is cured into a resilient layer after its introduction into the gap. In another preferred embodiment, the terminals on a chip carrier are planarized or otherwise vertically positioned by deforming the terminals into set vertical locations with a plate, and a liquid is then cured between the chip carrier and chip.

Despite the positive results of the aforementioned commonly owned inventions, still further improvements would be desirable.

SUMMARY OF THE INVENTION

The present invention provides a method and apparatus for providing a compliant interface for semiconductor chips to accommodate for the typically large thermal expansion mismatch between a chip and its support structure.

More specifically, one aspect of the present invention provides a method of fabricating a compliant interface for a semiconductor chip, typically comprised of a compliant encapsulation layer having a controlled thickness. A first support structure, such as a flexible, substantially inextensible dielectric film, having a surface is provided. A porous resilient layer, such as a layer of a plurality of compliant pads, is attached to the first surface of the first support structure, any two adjacent compliant pads defining a channel therebetween. Attaching the compliant pads to the first support structure may be accomplished a number of different ways. In one embodiment, a stencil mask having a plurality of holes extending therethrough is placed on top of the first surface of the support structure. The holes in the mask are then filled with a curable liquid elastomer. Desirably, liquid elastomer has a thick enough consistency so that the mask may then be removed before curing the elastomer. After the mask has been removed, the elastomer is at least partially cured, such as by heating or exposing to ultra-violet light. The filling step may be accomplished by screening the liquid elastomer across an exposed surface of the mask such that the elastomer is deposited into the holes of the mask. Other methods are also suitable, such as dispensing the elastomer into each of the holes individually. Thus, there is provided an assembly which includes an array of compliant pads further having channels between substantially all of the adjacent pads. At this stage of the process, the vertical height of the pads need not be extremely uniform.

In a further stage, the assembly including the array of pads is used with a second support structure. In one embodiment, the second support structure is a semiconductor chip having a plurality of contacts on a first surface. The first surface of the chip is abutted against the array of compliant pads and the contacts are electrically connected to a corresponding plurality of terminals on a second side of the support structure. Typically, the first surface of the chip is pressed against the pads to compress them, thus ensuring the chip is uniformly supported across its first surface and further ensuring the planarity of the first support structure, or flexible dielectric film, with respect to the first surface of the chip. Where the dielectric film has terminals thereon, the terminals desirably are held coplanar with one another during this step. For example, the dielectric film and the chip may be held between a pair of opposed platens, so that the terminals bear on one platen and are brought into a substantially coplanar condition. A compliant filler, such as a curable liquid elastomer, is then injected into the channels between the chip and the support structure and around the compliant pads while the chip and support structure are held in place. The elastomer may then be cured to form a substantially uniform, planar, compliant layer between the chip and the support structure.

In a further embodiment, the second support structure includes a plurality of chips. The array of compliant pads is large enough to overly several chips simultaneously. This method may be used to form a compliant interface for multiple chips which then may either be cut into individual chips or may be used as a multi chip module. The above method may also be used to form a compliant interface for a semiconductor wafer before the individual chips are separated. After the compliant interface is formed, the wafer may be cut into individual chips or into multi-chip modules.

A further embodiment provides for an array of compliant pads held in place using a holding element. The pads are then fixably placed to either a surface of the chip or the supporting substrate. The holding element is then removed and the pads are compressed between the chip and the supporting substrate. Liquid elastomer is injected into the channels between the adjacent pads, as described in the above embodiments.

The pads or the pad/injected elastomer combination provide a compliant, planar interface which effectively accommodates for the thermal coefficient of expansion mismatch between the chip and a supporting substrate thereby alleviating much of the stress on the connections therebetween. Further, the combination provides an effective encapsulation barrier against moisture and contaminants.

The foregoing and other objects and advantages of the present invention will be better understood from the following Detailed Description of Preferred Embodiments, taken together with the attached Figures.

DETAILED DESCRIPTION

Figure 1:
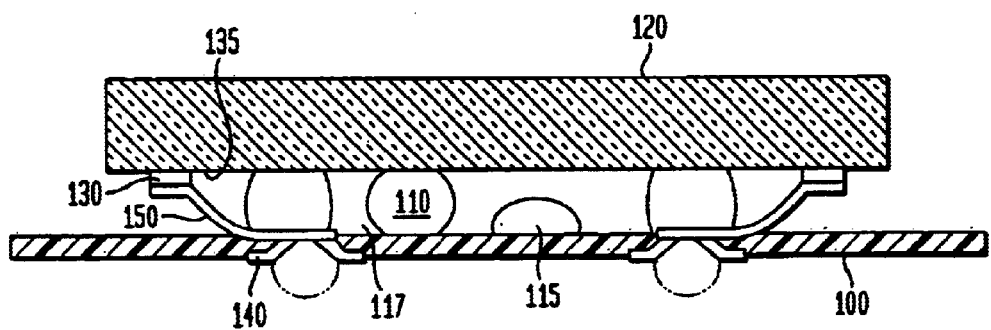
FIG. 1 shows a side view of one embodiment of a compliant semiconductor chip interface having a plurality of compliant pads, according to the present invention.
Figure 2:
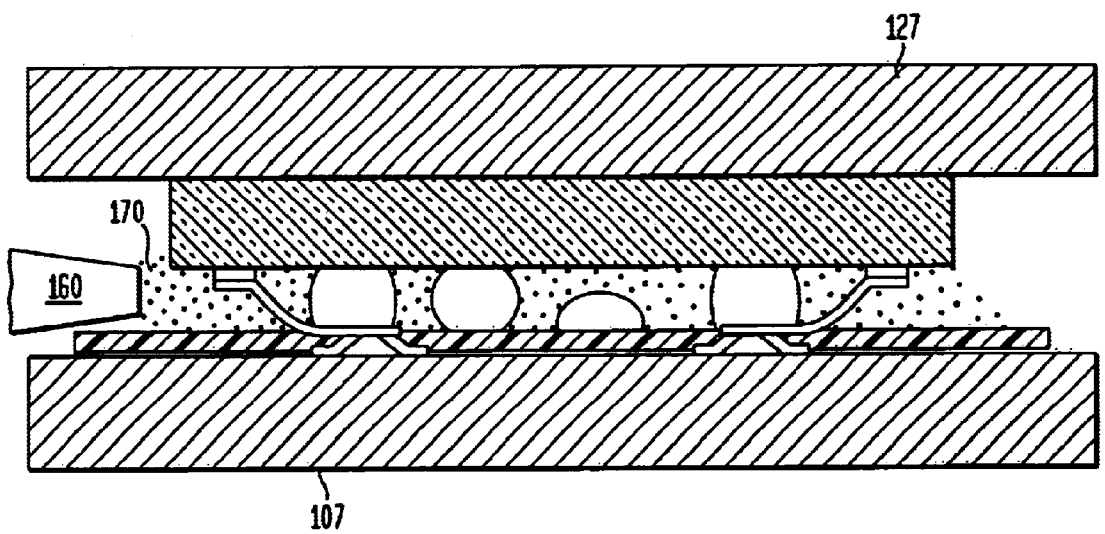
FIG. 2 shows a side view of the embodiment shown in FIG. 1, wherein the channels between the compliant pads are filled with a curable liquid, according to the present invention.

FIGS. 1 and 2 show a side view of a chip size package embodiment, according to the present invention. A support structure 100 is provided having a first and a second surface. The support structure 100 may be substantially rigid, semi-rigid or flexible. However typically, the support structures 100 is comprised of a flexible, but substantially inextensible, dielectric film, preferably formed from a polymeric material, such as KAPTON® "E" available from DuPont Chemical Corp., of an approximate thickness between 25 microns and 75 microns. Further, the dielectric film 100 typically has conductive terminals 140 on its second surface.

A porous layer, such as a layer of a plurality of compliant pads 110, is attached to the first surface of the film 100. The compliant pads 110 are typically made of an curable liquid elastomer material, such as the Dow Corning silicone elastomer 577, known as "Sylgard®", with about 5–10% of fumed silica in order to obtain a stiff, thixotropic consistency. The height of the compliant pads 110 is nominally uniform, as defined by the measurement from the base of the pads, at the first surface of the film, to the apexes of the pads. However, exact uniformity in height is not critical, as discussed below. The ratio of width to height of each pad 110 is desirably about two to one (2:1) or greater in order to maintain good pad structural integrity. Each pad desirably has width or diameter, measured at its juncture with first surface of the film 100, between about 300 ▓, to 2000 ▓. The pads are arranged in a grid pattern with center-to-center distance or "pitch" greater than the minimum width of each pad and preferably greater than the maximum width of each pad. Thus, each pair of mutually adjacent pads defines a channel 117 between them, and all of the channels are interconnected with one another to define a substantially continuous grid of channels 117. The pad pitch and hence the width of the channels 117 must be large enough to allow a compliant filler material 170 to be injected into the channels 117, as described in greater detail below.

Figure 3A:
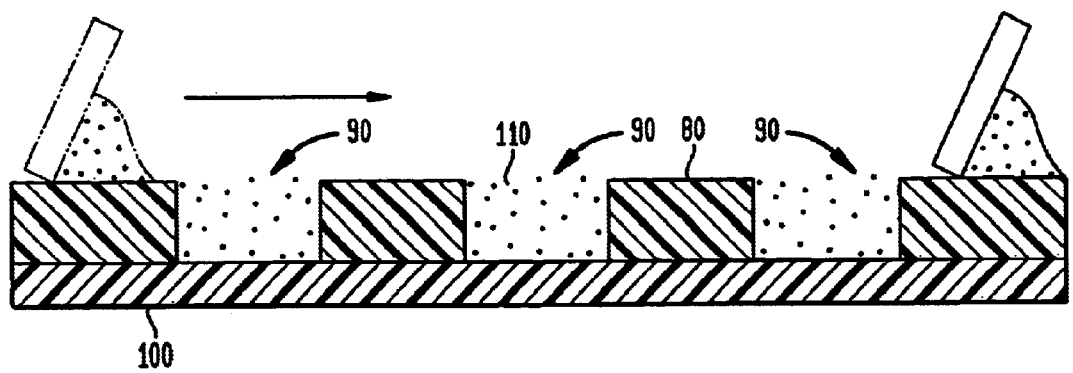
FIGS. 3A and 3B show a side view of the mask and elastomer used to form the compliant pads, according to further embodiments of the invention.
Figure 3B:
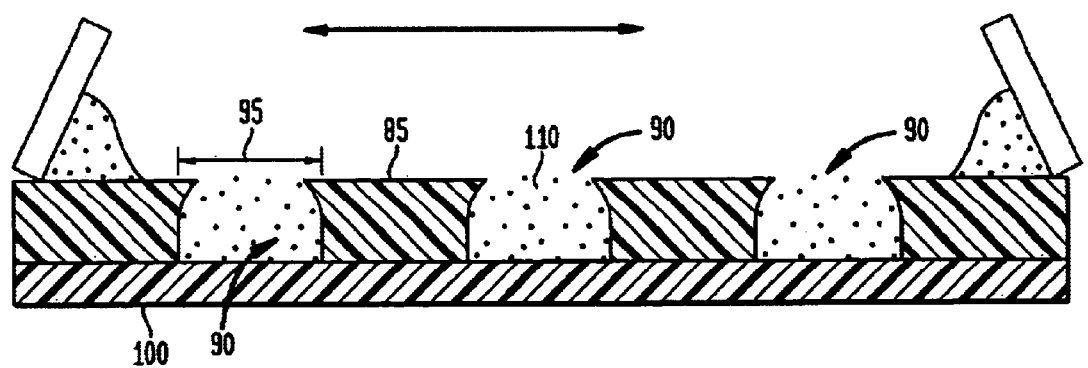

As shown in FIGS. 3A and 3B, the compliant pads 110 are typically formed and attached to the dielectric film 100 using a stencil mask 80 having top and bottom surfaces and further having a plurality of holes 90 extending therethrough. In a preferred embodiment, the bottom surface of the mask 80 is placed atop the first surface of the film 100 and curable liquid elastomer is wiped or screened across the first surface of the mask 80 so that the elastomer is deposited into each of the holes 90. If the elastomer is viscous or thixotropic enough, the mask is then typically removed and the pads are cured or partially cured by heating or exposing them to ultra violet light or a combination thereof, such as by exposing the elastomer to ultraviolet light to create a "skin" of cured elastomer and then curing or partially curing the elastomer by a heating step. In the case of Dow 577 elastomer, the elastomer is typically heated to approximately 125° C. for 40 minutes.

The mask 80 may also be removed after the curing step. In this case, the elastomer will conform to the shape of the hole 90 in the mask as it begins to cure. Thus, the pads 110 in FIG. 3A will be cylindrical in shape with substantially flat top surfaces. If the mask 80 is left atop the dielectric film 100 during the curing step, the pads may partially adhere to the mask 80 at an exposed top edge of each hole 90 on the first surface of the mask as the elastomer cures. This makes removal of the mask 80 while maintaining the integrity of the pads 110 difficult. This problem can be effectively dealt with by using an alternate stencil mask 85, shown in FIG. 3B, where each hole in the mask has a smaller top edge circumference on the top surface of the mask 85 than on the bottom surface of the mask 85. The smaller circumference of each hole reduces the strength of the attachment of the compliant pads 110 to the mask 85. However, because of the shape of enclosure 95 of the embodiment shown in FIG. 3B, the liquid elastomer typically must be screened across the first surface of the mask in two directions to ensure the enclosure 95 is completely filled. The elastomer will then take on a rounded shape corresponding the shape of the enclosure 95 and will retain its shape after curing. The Dow 577 elastomer, discussed above, also shrinks by approximately 5% during the curing step thereby facilitating the removal of the mask 85. Another solution to this problem would be to coat the mask 80 with a material that will resist the adherence of the elastomer as it cures.

Returning to FIG. 1, a semiconductor chip 120 is next abutted to the compliant pads 110. The chip 120 has contacts 130 on a contact-bearing surface 135 and a back surface. The face surface of the chip is aligned with the compliant pads so that the none of the pads 110 cover the contacts on the chip. In the next step of the operation, the dielectric film 100 and the second support structure or chip 120 are squeezed together between a first platen 107 and a second platen 127. The platens are urged toward one another by a press (not shown). The first platen bears on the terminals 140 of the film 100, and forces these terminals into substantially coplanar alignment, whereas the second platen bears on the back surface of chip 120. During this process, the pads 110 are compressed. The extent of such compression varies from pad to pad, depending upon the original height of each pad, the heights of the various terminals 140 and other tolerances. Because the pads can accommodate variations in this manner, the heights of the pads prior to compression need not be precisely uniform. Some particularly short pads, such as pad 115, may not contact the chip surface even after compression. This situation is acceptable provided that the remaining pads substantially support the terminals 140 against the first platen.

Where the pads 110 are only partially cured during the pad forming process, described above, they are tacky and adhere to the chip 120 when it is compressed thereagainst. In a preferred embodiment, the chip 120 would be heated to about 100° to 180° C. and then compressed against the pads 110 so that the partially cured pads 110 fully cure due to the heat of the chip 120 and in so doing adhere to the face surface of the chip. Alternatively, the apex of each pad may be made tacky by providing an adhesive, a silicone gel, or a film of uncured silicone elastomer thereon so that the chip 120 adheres thereto. Similarly, the chip surface may be coated with an adhesive in the regions remote from the contacts 130 so that the tips of the pads 110 engage such adhesive. While adherence of the pads 110 to the chip 120 helps maintain the alignment between the chip 120 and the film 100, it is not imperative that the pads 110 are adhered to the chip 120 so long as the chip can be held in place by compressing it against the pads 110. The heat and pressure applied during this step of the process permanently deform or "set" the pads to the heights and shapes achieved when the film and chip are squeezed between the platens. Once set in this manner, the pads tend to retain the film and chip in the same relative positions as achieved during the squeezing step, and thereby tend to retain the terminals 140 in coplanar alignment with one another.

The contacts 130 on the chip 120 are then attached to the terminals 140 on the film 100 through any suitable means. In this embodiment, each contact 130 is electrically connected to one terminal 140 through a flexible lead 150 extending therebetween. The terminal 140 is comprised of a conductive blind via (a via extending from the second to the first surface of the film 100 and having a closed bottom surface substantially in a plane with the first surface of the dielectric film 100) and a solder ball (shown in dashed lines), which is typically attached after the package is complete.

As shown in FIG. 2, a low viscosity compliant filler 170 is then disposed between the chip 120 and the dielectric film 100 through the channels between the adjacent pads 110. An injection nozzle 160 is disposed adjacent an edge of the film 100. The filler 170 passes through the nozzle into the channels 117. The compliant filler 170 may be comprised of an elastomer, a gel or a compliant thixotropic material so long as the elastomer, gel or material retains its compliancy. One example of such a filler is Dow Corning elastomer Q1-4939. In a preferred embodiment, the filler 170 is comprised of a curable liquid elastomer having a viscosity adapted to facilitate flow of the liquid into the channels 117 between the adjacent pads 110. An evacuated environment can also be provided during the elastomer flow so that voids in the liquid elastomer caused by trapped air may be eliminated. Capillary action tends to pull the low viscosity liquid elastomer 170 into the channels 117 as the elastomer wets the pads, the chip and the film. The liquid elastomer 170 tends to remain between the chip and the substrate because of the surface tension forces. If necessary, however, the edges of the assembly may be closed by any suitable means to trap the liquid 170. During this process, the liquid elastomer also encapsulates leads 150. The liquid 170 is then cured, typically by heating the assembly while it is held between flat opposing surfaces, such as the platens 107, 127 used for the compression step. This results in a planar, compliant interface between the chip 120 and the dielectric film 100. The resulting assembly may then be freed to form an individual semiconductor chip package.

Figure 4A:
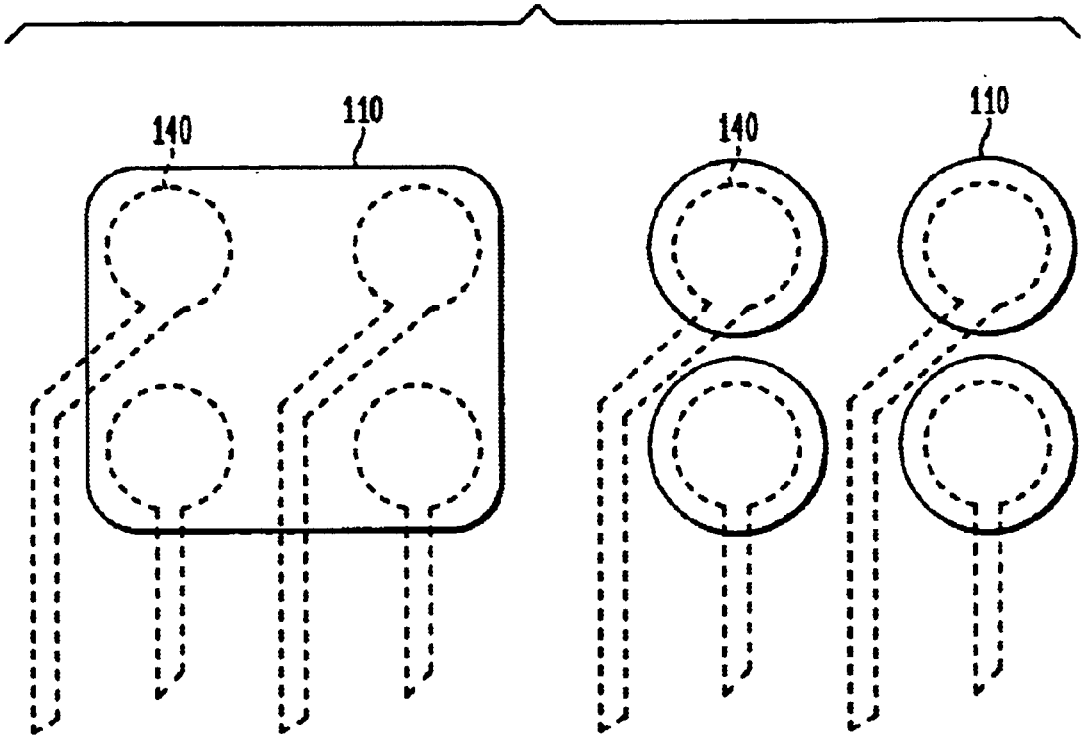
FIGS. 4A–C show a top plan view of several different pad shapes and registrations in relation to the terminal's positions, according to further embodiments of the invention.
Figure 4B:
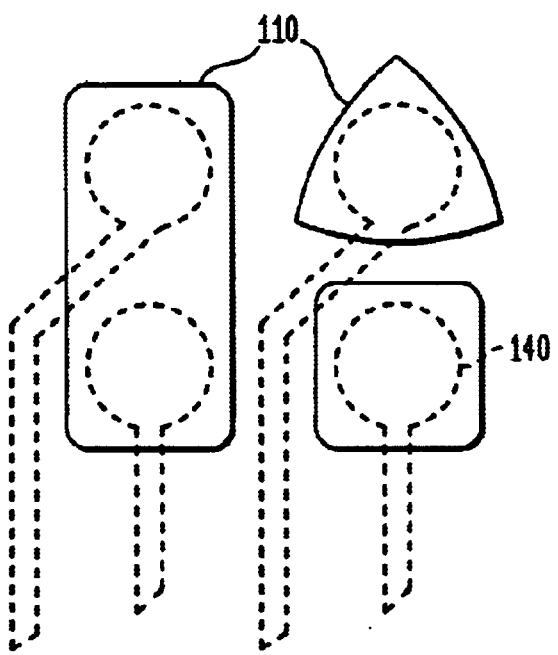
Figure 4C:
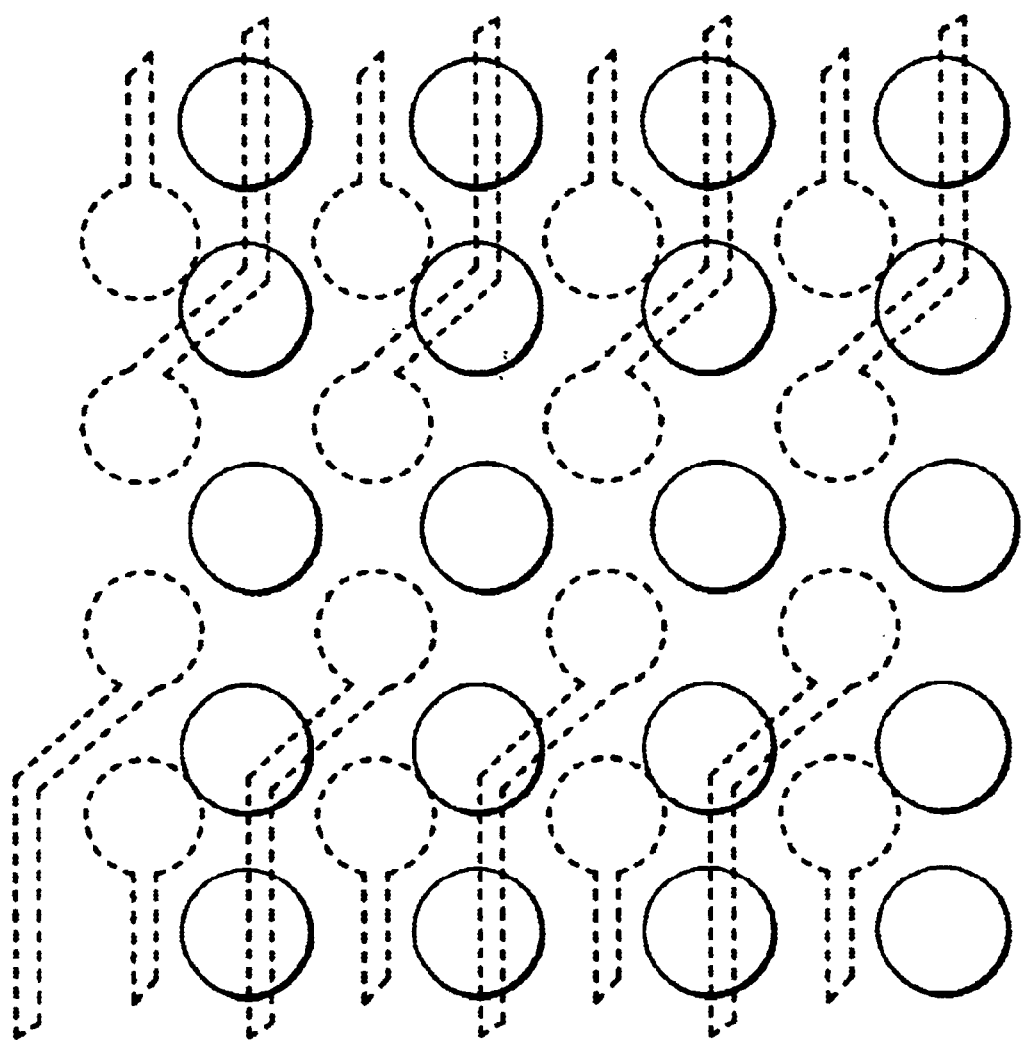

It is important to understand that the function of the compliant pads is to provide a uniformly supported, planar standoff between the chip and the dielectric film, while allowing the compliant filler to be injected between the adjacent pads 110 to create a compliant encapsulation layer having a controlled thickness. So long as there is uniformity of support, it does not matter whether the pads 110 are in direct registration with single or multiple terminals 140, as shown in FIGS. 4A and 4B, or whether the pads 110 are in random registration win respect to the terminals 140, as shown in FIG. 4C. It also does not matter whether all of the pads in a common array are of the same general shape or dimension.

Figure 5A:
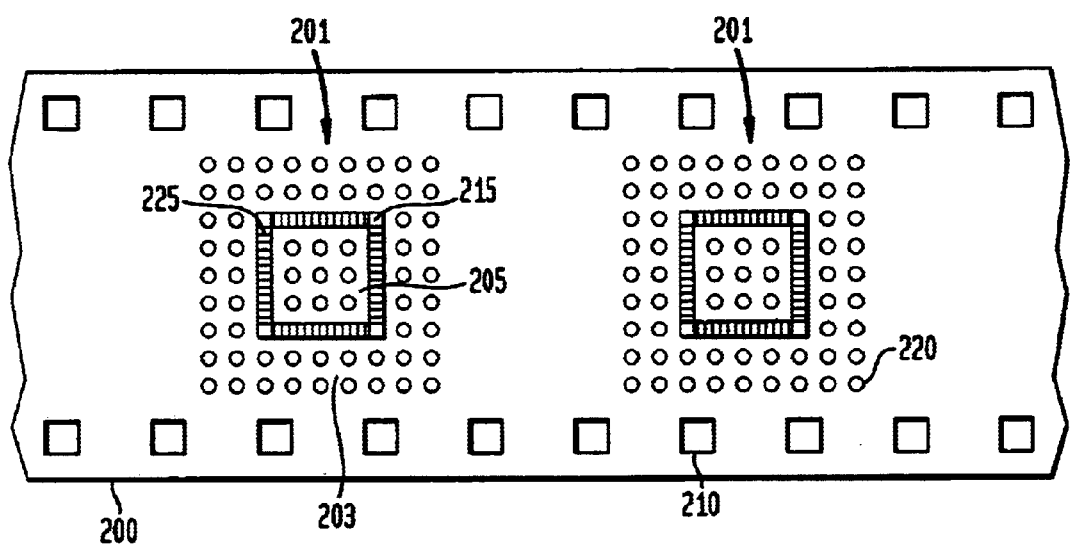
FIGS. 5A and 5B show a perspective and a side view of the support structure and compliant pads, according to a further embodiment of the present invention.

FIG. 5A shows a top plan view of a preferred embodiment of the first support structure and the compliant pads. Tape 200 is a continuous elongated strip of film with handling and locating features such as sprocket holes 210 adapted for engagement by tape-handling equipment of the type commonly employed in tape automated bonding or "TAB" processing in the semiconductor industry. Tape 200 includes a plurality of regions 201 spaced apart along its length, each such region constituting a support structure 205 for one chip. Each region has pads 220 disposed in a grid on its first surface so that the pads define channels 203 therebetween, and has terminals 207 on its second surface, the terminals being connected to leads 225 extending across an aperture or "bond window" 215 in the tape, the bond window being in the form of a slot extending around a rectangular loop. The leads are adapted for bonding to the contacts of the chip. For example, each lead may have a detachable section as disclosed in International Patent Publication WO 94/03036, the disclosure of which is hereby incorporated by reference herein. The terminals and leads can be arranged in a "fan out" pattern, wherein the terminals are disposed on that portion of the tape outside of the loop defined by the bond window; in a "fan in" pattern wherein the terminals are disposed on that portion of the tape encircled by the bond window; or both. Such a tape can be mass-produced, to include numerous regions.

Figure 5B:
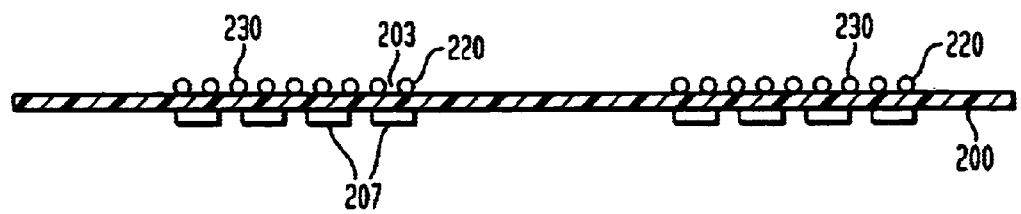

In use, a series of chips can be bonded to the various regions of the tape by abutting each chip against the compliant pads of one region and compressing and bonding the chip and pads in the same manner as discussed above. Each pad 220 may be only partially cured, or else may have a tacky layer 230 (FIG. 5B) of adhesive, silicone gel or uncured silicone elastomer on its apex, so that the pads will adhere to the chip. Alternatively or additionally, the chip may have such a tacky layer on its first surface in areas remote from the contacts. During the abutting step, the tape is juxtaposed with each chip so that one region of the tape overlies the chip, and the contacts of each chip are brought into coarse alignment with the leads of the associated region of the tape, using conventional machine-vision alignment techniques. This alignment is maintained during the compressing and pad bonding steps. After the pads have been bonded to the surfaces of the chip, the bonded pads maintain the alignment of the leads and contacts. The terminals of each region are electrically connected to the contacts of the associated chip, as by advancing a bonding tool into the bond window to engage each lead and connect it to the aligned contact of the chip.

Preferably, the bonding tool captures the bond region of the lead and brings it into more precise alignment with the chip contact. After bonding the leads, the compliant filler is introduced into the channels 203 between the pads, in substantially the same way as described above. Typically, the film 200 and the chip are compressed while the liquid material is introduced. These operations may be performed at separate stations of a processing line. At any time after the pads of a region have been bonded to a chip, the chip can be transported to the next station of the processing line by moving the tape using the sprocket holes 210. Each region of the tape can be severed from the remainder of the tape after all of the process steps have been completed to provide an individual chip and film assembly. Alternatively, each region can be severed before the final process step, and a portion of the process can be completed after severance. In a further embodiment of the invention, a plurality of individual regions of the tape may remain connected to one another.

Typically, each of these leads 225 will be detached within or near an edge of the bonding window 215 when such lead is connected to a respective chip contact pad. If the leads and the terminals are arranged in a fan-out pattern, this action detaches the tape center portion 205, generally centered within the loop defined as the bonding window 215 from the outer portions of the tape. However, the compliant pads 220 disposed on the tape center portion 205 provides support for the leads 225 during the bonding phase. Conversely, in a fan-in arrangement, the exterior portion of each region may optionally be removed after connecting the leads.

Figure 5C:
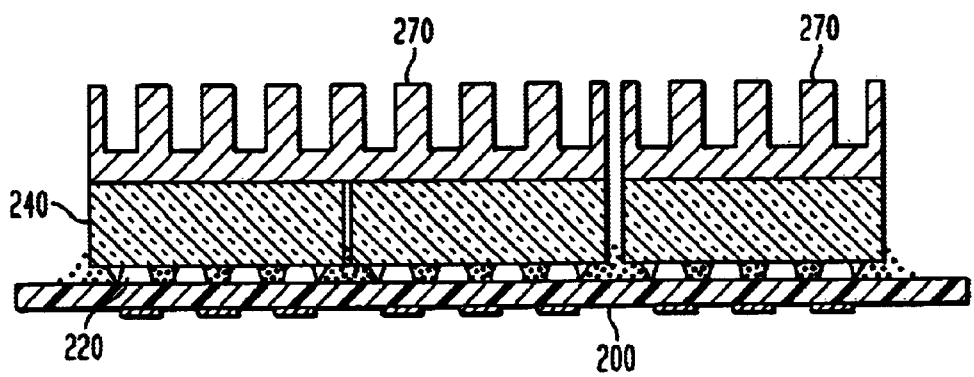
FIG. 5C shows a side view of the embodiment shown in FIGS. 5A and 5B, wherein multiple encapsulated chips have been abutted against the compliant pads.

In the alternative embodiment shown in FIG. 5C, a plurality of individual regions 201 of the tape remain together and are not severed from one another during the process. A short length of tape thus retains a plurality of chips side-by-side, as a multi-chip module. Thus, as illustrated in FIG. 5C, the back surfaces of these chips or modules may be mated to heat spreader/sinks 270 before or after the step of cutting the short length of tape bearing the chips free from the remainder of the tape. Further, a thermally conductive die attach material may be used between the chips 240 and the heat spreader 270 to aid in the transfer of heat from the chips. Such die attach materials are widely used in the semiconductor industry.

In a further alternative arrangement, a plurality of individual regions, each adapted to form a support structure for an individual chip, are formed side-by-side in a two-dimensional array on a unitary film in the shape of a panel. Plural chips are attached to these regions in the same manner as discussed above, so as to form a multi-chip assembly. In either arrangement where plural chips are employed, the steps of abutting and compressing the pads and injecting the liquid compliant filler can be performed simultaneously for all of the chips, using platens large enough to accommodate the entire array, or seriatim so that each chip is processed separately.

Figure 6:
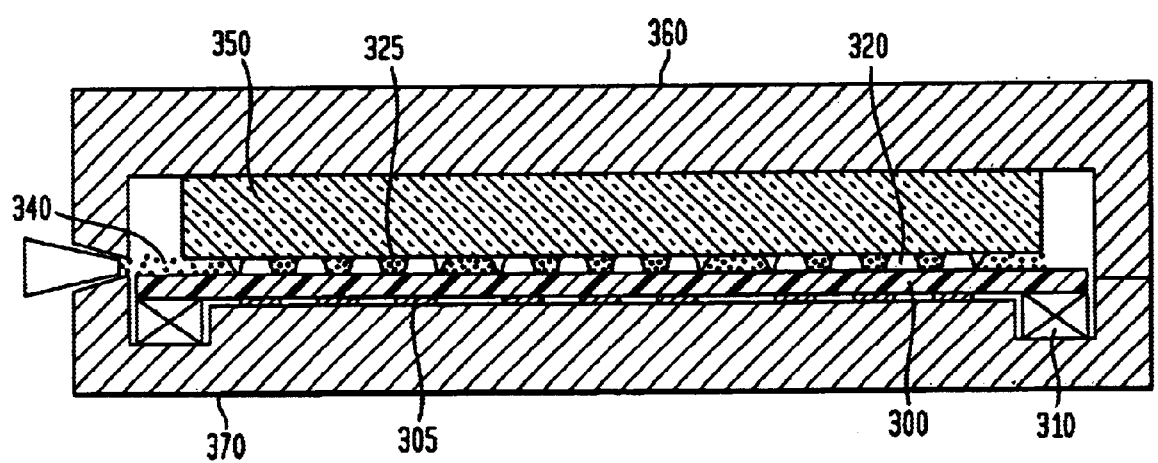
FIG. 6 shows a side view of a compliant interface being formed between a wafer and the support structure, according to a further embodiment of the present invention.

FIG. 6 shows a side view of a compliant interface, as described in reference to FIGS. 1 and 2, being formed between a second support structure or semiconductor wafer 350 having contacts (not shown) on a first surface and a first support structure or film 300. The wafer 350 includes an integral plurality of individual chips, each defining a portion of the first surface, and each including a plurality of contacts thereon. The film 300 has terminals 305 on its second surface, with leads (not shown) connected to the terminals 305. The terminals 305 and to leads are disposed in a plurality of regions, each corresponding to one chip. Each region of the film may include a bond window (not shown), as discussed above.

Before engagement with the wafer 350, compliant pads 320 defining channels 325 therebetween are formed on the first surface of the film. Here again, each pad 320 may be only partially cured, or may have a curable tacky material on its apex. The film 300 is stretched taut and bonded to a rigid ring structure 310. The film 300 is then aligned with the wafer so that each region of the film is aligned with one chip of the wafer, and so that the leads are aligned with the contacts. The wafer is then abutted against the compliant pads 320. A platen 360 is applied on the back surface of the wafer 350. Another platen 370 is applied on the second surface of the film so as to engage the terminals 305. In the same manner as described above, the platens are forced toward one another, thereby compressing pads 320 and bringing the contacts 303 into substantially coplanar alignment with one another. While the contacts and pads are held in this position, the pads may be fully cured or set by heating the platen 360/wafer 350, thereby securing the film in position on the wafer. Alternately, a tacky adhesive may be applied to the first surface of the wafer around the contacts thereon to ensure the adherence of the pads 320 to the wafer 350. After this operation, the leads are bonded to the wafer contacts, followed by injection of the liquid curable elastomer 340 into the channels 325. While the contacts are again held in position by the platens, the liquid elastomer is cured to form a complete assembly encompassing the entire wafer and all regions of the film.

Individual, fully encapsulated parts may then be cut from the wafer. These separated parts will have a compliant interface to accommodate for the thermal coefficient of expansion mismatch between the parts and their eventual supporting substrates, such as printed wiring boards. Further, the encapsulant protects the individual parts from moisture and contaminants.

Figure 7:
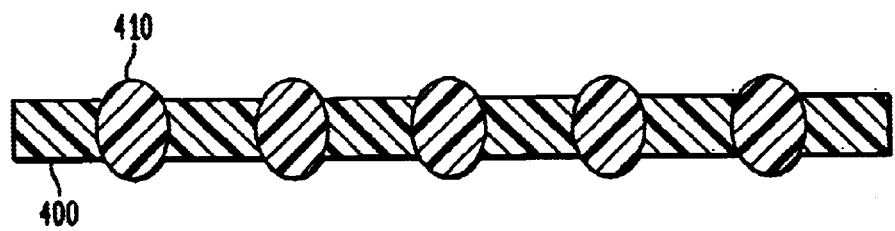
FIG. 7 shows a side view of a plurality of compliant pads disposed within holes in a holding element, according to a further embodiment of the present invention.

FIG. 7 shows a further embodiment having an array of compliant pads 410 held in place using a holding element 400. The pads 410 are then fixably placed atop either the contact bearing surface of a semiconductor chip (second support structure) or a flexible dielectric film (first support structure) typically by placing a tacky adhesive onto one of those surfaces. The holding element 400 is then removed. Desirably, the holding element 400 is made of a material which will break apart or peel off the pads easily so that the adherence of the pads 410 to either the wafer or the film is not comprised. The pads 110, as shown in FIG. 1, are not typically screened across and cured to the contact bearing surface of the chip for fear that the contacts will be contaminated by stray uncured elastomer. In the embodiment shown in FIG. 7, however, the pads are being attached after they have been either fully cured or partially cured to the point that they may retain their individual structural integrity. Thus, the pads 410 may be accurately placed and typically adhered on the chip's surface without any substantial fear that the chip's contacts will be contaminated. The pads are then compressed between the chip and the supporting substrate using platens and liquid elastomer is next injected into the channels between the adjacent pads and cured, as described more fully in relation to the above embodiments.

Figure 8:
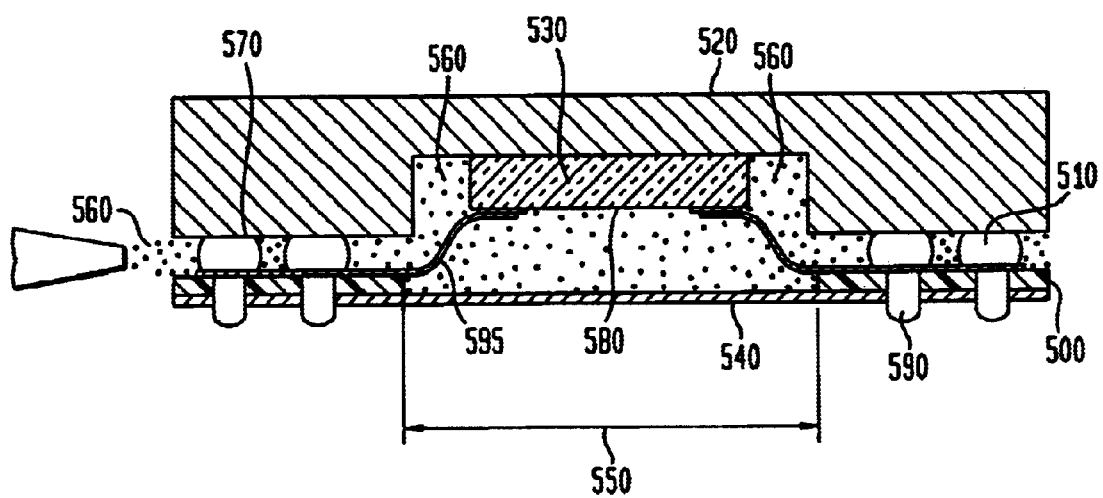
FIG. 8 shows a side view of a further embodiment of the invention having a compliant interface between a heat spreader and a support structure.

The embodiment shown in FIG. 8 shows a side view of an alternate embodiment in which the pads 510 are compressed between a second support structure which includes a heat spreader 520 having an indentation on its first side and a first support structure 500, which includes a flexible dielectric film. A chip 530 is disposed within the indentation of the heat spreader 520 so that the front or contact-bearing surface 580 of the chip faces outwardly at the opening of the indentation, and thus faces outwardly from the first surface 570 of the heat spreader. Dielectric film 500 has a bond window 550, terminals 590 on one surface and leads 595 connected to the terminals 590. After pads 510 are provided on the dielectric film 570 or the heat spreader by any of the techniques discussed above, the dielectric film 500 and the heat spreader 520 are aligned so that the outer portions of the dielectric film overly the first surface 570, and so that the bond window 550 is aligned with the contacts on the chip. The leads 595 are bonded to the contacts of the chip. After bonding the leads, the bond window is closed by a sheet 540 of a further dielectric material such as a solder mask material which adheres to film 500 and thus forms a continuation of the film 500. Typically before bonding the leads, the pads 510 are compressed against first surface 570 by engaging the heat spreader 520 and the film 500 between a pair of platens (not shown) so that one such platen bears on the rear surface of the heat spreader, opposite from surface 570 and so that the other platen bears on terminals 590. This compression brings the terminals into coplanar alignment. As described above, the liquid compliant filler 560 is injected into the channels between the pads and cured while the platens hold the system in compression. In this embodiment, the pads are not provided at the interface between sheet 540 and the chip 530. If a solder mask 540, or other suitable containing means, is placed over the bonding window 550, a compliant filler material 560 may be injected between the adjacent pads 510 creating a planar, compliant interface while simultaneously encapsulating the chip 530.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

Although the present invention has been described with reference to particular preferred embodiments, it is to be understood that the embodiments are merely illustrative of the principles and application of the present invention. It is therefore understood that numerous modifications may be made to the preferred embodiments of the present invention without departing from the spirit and scope of the present invention as defined by the claims.

What is claimed is:

1. A method of fabricating a compliant interface for a semiconductor chip comprising:

providing a first support structure having a first surface and a porous resilient layer on the first surface of the first support structure;

stretching the first support structure;

bonding the stretched first support structure to a ring structure;

providing a platen in engagement with a second surface of said first support structure;

abutting a first surface of a second support structure against the porous layer, and disposing a first curable liquid between the first and second support structures and within the porous layer after the abutting step.

2. The method of claim 1, wherein the first support structure is a film having a second surface remote from the first surface of said first support structure.

3. The method of claim 2, further comprising disposing a plurality of terminals on said second surface of said first support structure.

4. The method of claim 3, further comprising connecting a lead to each of the terminals of said first support structure.

5. The method of claim 4, wherein the porous resilient layer comprises a plurality of compliant pads.

6. The method of claim 5, wherein each of the compliant pads is at least partially cured.

7. The method of claim 5, wherein each of the compliant pads has an apex and a curable adhesive disposed on said apex.

8. The method of claim 5, further comprising curing each of the compliant pads before disposing the first curable liquid.

9. The method of claim 5, further comprising simultaneously curing the compliant pads and the first curable liquid.

10. The method of claim 5, wherein the second support structure is a semiconductor wafer.

11. The method of claim 10, wherein the semiconductor wafer includes a plurality of contacts disposed on the first surface of said wafer.

12. The method of claim 11, further comprising bonding each of the leads to one of the contacts before disposing the first curable liquid.

13. The method of claim 12, further comprising disposing an adhesive on the first surface of said wafer before the abutting step.

14. The method of claim 13, further comprising curing the first curable liquid after the bonding step.

15. The method of claim 14, further comprising compressing the compliant pads between the film and the wafer prior to the disposing step.

16. The method as claimed in claim 15, wherein the compressing step includes engaging the film and the wafer between the first platen and a second platen in engagement with the wafer and urging the platens together.

17. The method as claimed in claim 16, wherein the plurality of terminals on the second surface of said film are remote from the wafer, wherein one of the platens bears on the terminals so as to bring the terminals into substantially coplanar alignment with one another before the disposing step.

18. The method as claimed in claim 17, wherein the compressing step includes curing the compliant pads so that the pads retain the terminals in said substantially coplanar alignment.

19. The method as claimed in claim 18, wherein the film is a flexible dielectric sheet.

20. A method of making a microelectronic assembly comprising:

providing a first support structure having a first surface and a second surface, said first support structure including a plurality of terminals exposed at the second surface of said first support structure;

juxtaposing a second support structure having a first surface with said first support structure so that the first surface of said second support structure faces the first surface of said first support structure, the first surface of said second support structure including an indentation facing toward the first surface of said first support structure;

providing a plurality of compliant pads in contact with the first surface of said first support structure and the first surface of said second support structure, said compliant pads defining channels therebetween; and disposing a compliant filler in the channels between said compliant pads.

* * * * *